United States Patent
Liang et al.

(10) Patent No.: US 9,418,928 B2
(45) Date of Patent: Aug. 16, 2016

(54) PROTRUSION BUMP PADS FOR BOND-ON-TRACE PROCESSING

(71) Applicant: Taiwan Semiconductor Manufacturing Company, Ltd., Hsin-Chu (TW)

(72) Inventors: Yu-Min Liang, Zhongli (TW); Jiun Yi Wu, Zhongli (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 11 days.

(21) Appl. No.: 14/453,858

(22) Filed: Aug. 7, 2014

(65) Prior Publication Data

US 2015/0194405 A1    Jul. 9, 2015

Related U.S. Application Data

(63) Continuation-in-part of application No. 14/148,482, filed on Jan. 6, 2014, now Pat. No. 9,275,967.

(51) Int. Cl.
| | |
|---|---|
| *H01L 21/00* | (2006.01) |
| *H01L 23/498* | (2006.01) |
| *H01L 21/48* | (2006.01) |
| *H05K 3/40* | (2006.01) |
| *H01L 23/00* | (2006.01) |
| *H05K 1/11* | (2006.01) |
| *H05K 3/46* | (2006.01) |

(52) U.S. Cl.
CPC ...... *H01L 23/49838* (2013.01); *H01L 21/4853* (2013.01); *H01L 23/49811* (2013.01); *H05K 3/4007* (2013.01); *H01L 24/16* (2013.01); *H01L 2224/0401* (2013.01); *H01L 2224/131* (2013.01); *H01L 2224/13082* (2013.01); *H01L 2224/16225* (2013.01); *H01L 2224/16238* (2013.01); *H01L 2924/12042* (2013.01); *H01L 2924/14* (2013.01); *H05K 1/111* (2013.01); *H05K 3/4682* (2013.01); *H05K 2201/0367* (2013.01); *H05K 2201/10674* (2013.01)

(58) Field of Classification Search
CPC .................. H01L 23/49838; H01L 23/49811; H01L 21/4853
See application file for complete search history.

(56) References Cited

U.S. PATENT DOCUMENTS

| | | |
|---|---|---|
| 5,892,277 A | 4/1999 | Ikemizu et al. |
| 6,087,251 A | 7/2000 | Hsu |
| 6,348,398 B1 | 2/2002 | Wang |
| 6,352,916 B1 | 3/2002 | Tang et al. |
| 6,388,322 B1 | 5/2002 | Goossen et al. |
| 6,465,886 B1 | 10/2002 | Horiuchi et al. |
| 6,627,824 B1 | 9/2003 | Lin |

(Continued)

FOREIGN PATENT DOCUMENTS

| | | |
|---|---|---|
| CN | 102054811 | 5/2011 |
| TW | 200408080 A | 10/2004 |

(Continued)

*Primary Examiner* — Richard Booth
(74) *Attorney, Agent, or Firm* — Slater Matsil, LLP

(57) ABSTRACT

An embodiment apparatus includes a dielectric layer, a conductive trace in the dielectric layer, and a bump pad. The conductive trace includes a first portion having an exposed top surface, wherein the exposed top surface is recessed from a top surface of the dielectric layer. Furthermore, the bump pad is disposed over and is electrically connected to a second portion of the conductive trace.

20 Claims, 16 Drawing Sheets

(56) References Cited

U.S. PATENT DOCUMENTS

| | | |
|---|---|---|
| 6,951,773 B2 | 10/2005 | Ho et al. |
| 8,127,979 B1 | 3/2012 | Wu et al. |
| 8,198,140 B2 | 6/2012 | Murai et al. |
| 8,952,538 B2 | 2/2015 | Matsuki |
| 2002/0048944 A1 | 4/2002 | Tang et al. |
| 2002/0187585 A1* | 12/2002 | Tsukada ............ H01L 24/11 438/106 |
| 2009/0121349 A1 | 5/2009 | Suzuki |
| 2011/0101526 A1 | 5/2011 | Hsiao et al. |
| 2011/0133334 A1* | 6/2011 | Pendse ............ H01L 21/563 257/737 |
| 2012/0098120 A1 | 4/2012 | Yu et al. |
| 2012/0175774 A1 | 7/2012 | West et al. |
| 2013/0328189 A1 | 12/2013 | Pendse |
| 2014/0035095 A1 | 2/2014 | Lin et al. |
| 2014/0151867 A1 | 6/2014 | Lin et al. |

FOREIGN PATENT DOCUMENTS

| | | |
|---|---|---|
| TW | 200625559 | 7/2006 |
| TW | 201115700 A | 5/2011 |
| TW | 201208024 | 2/2012 |
| TW | 201220989 A | 5/2012 |
| TW | 201246466 | 11/2012 |
| TW | 201304026 | 1/2013 |
| TW | M462949 | 10/2013 |

* cited by examiner

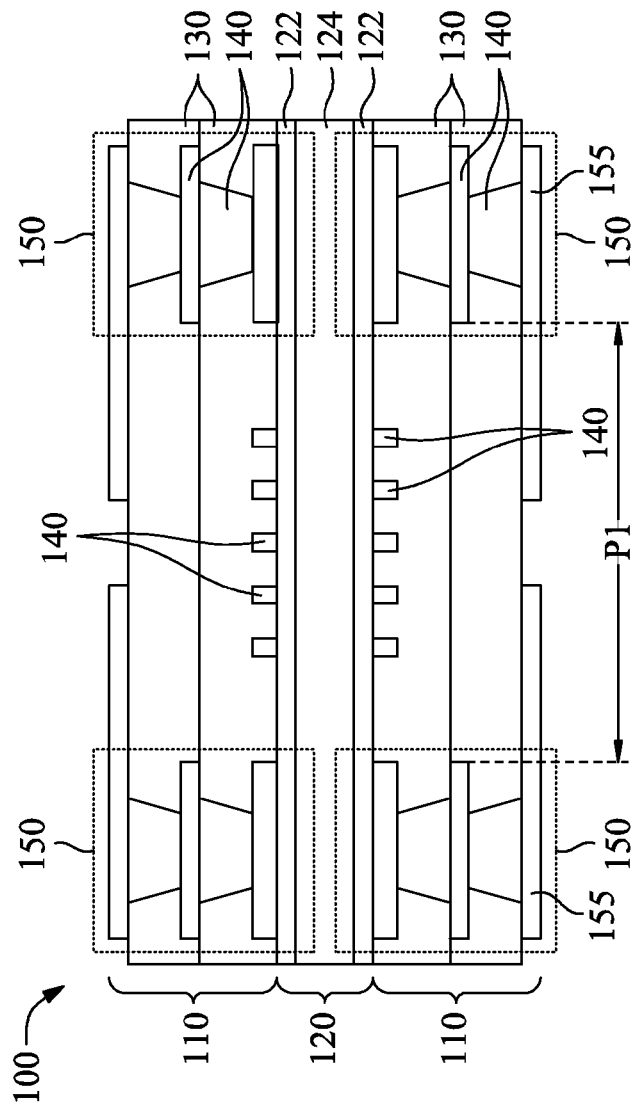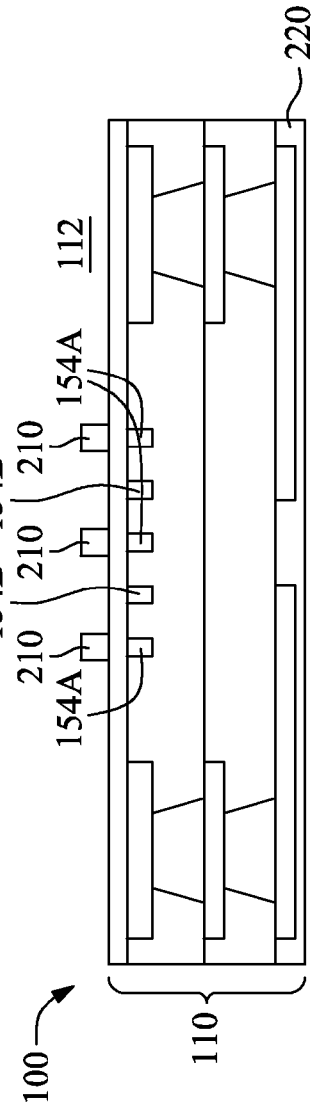

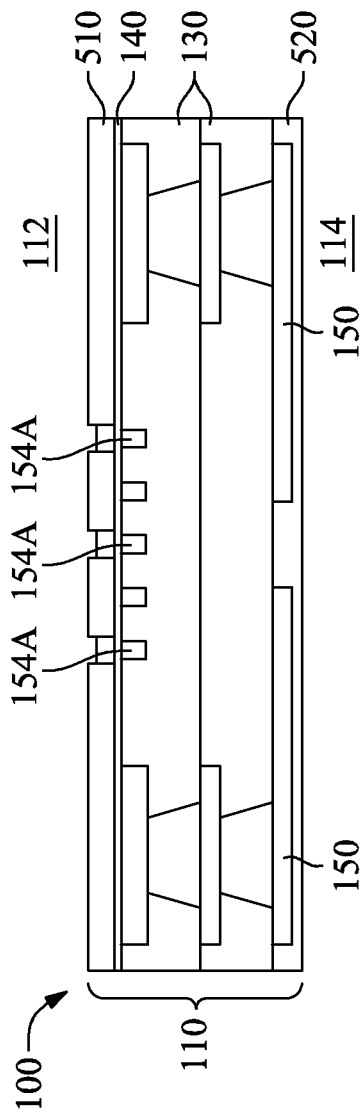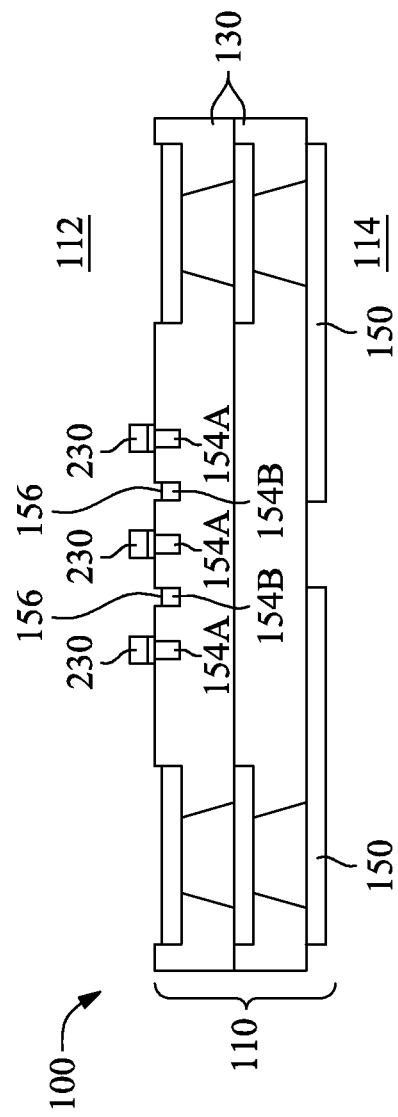

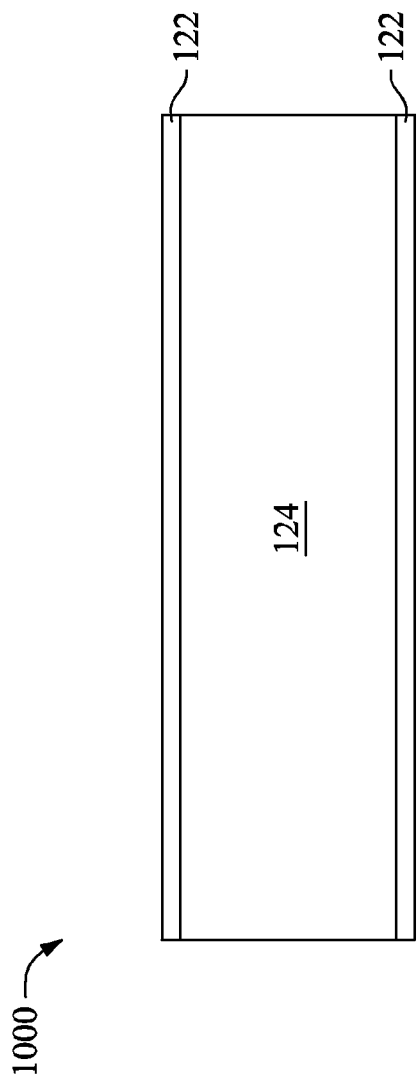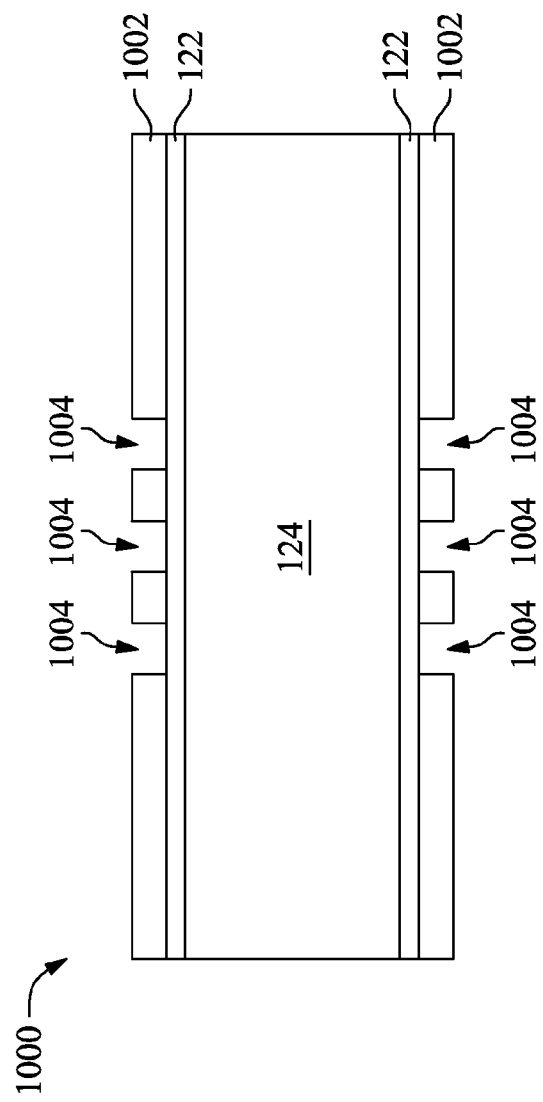

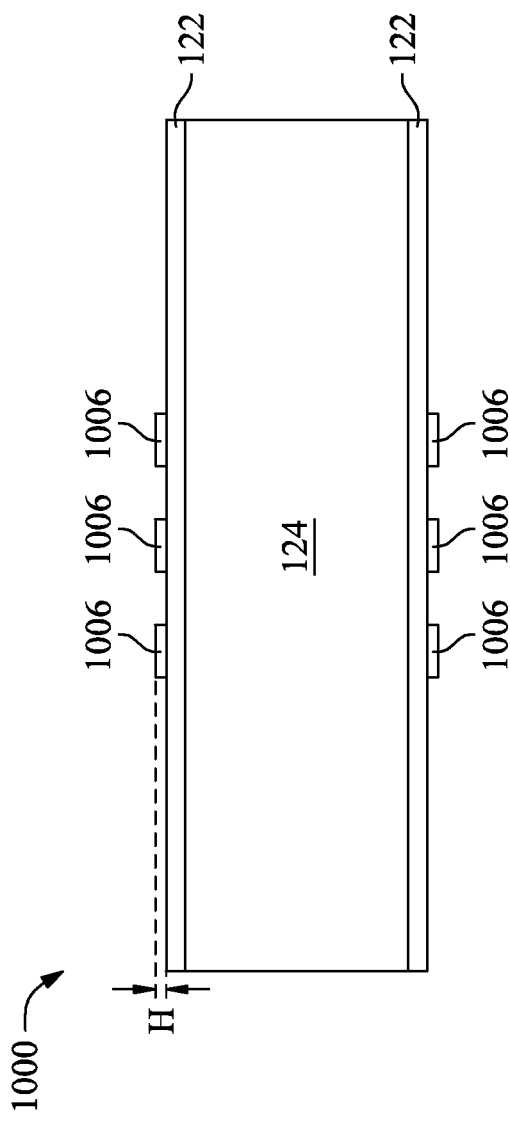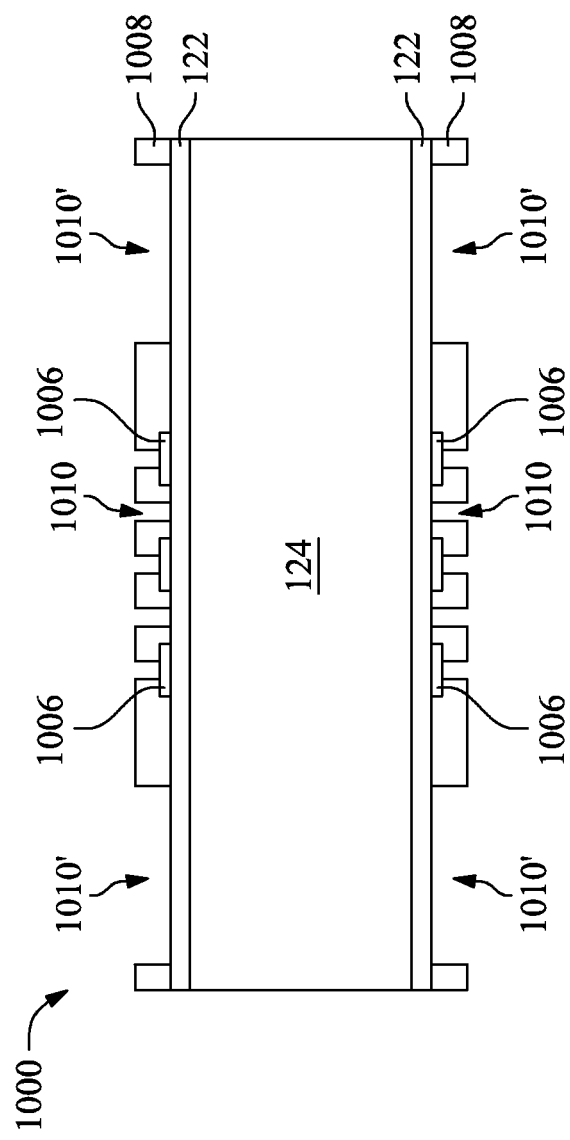

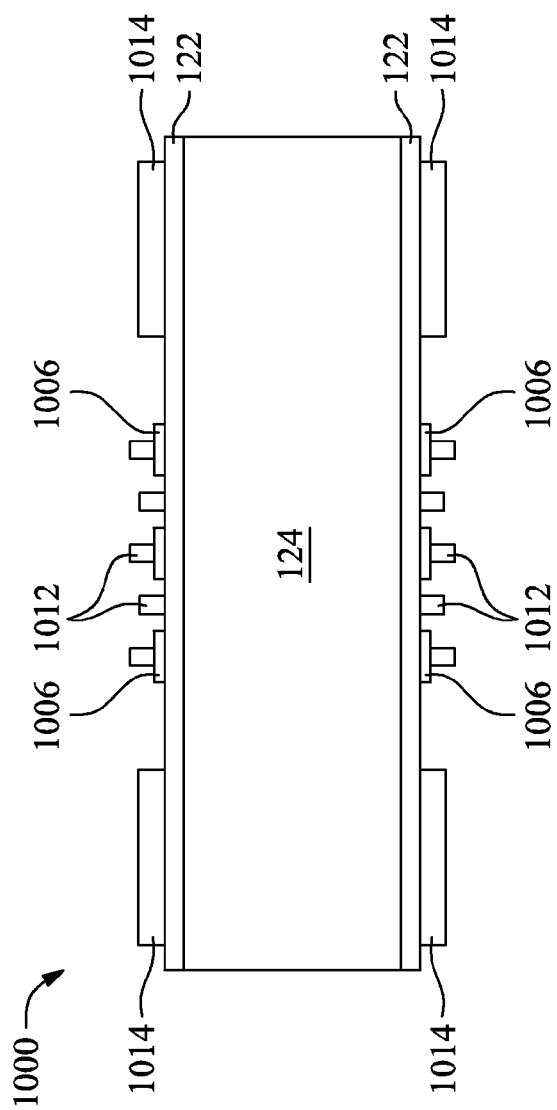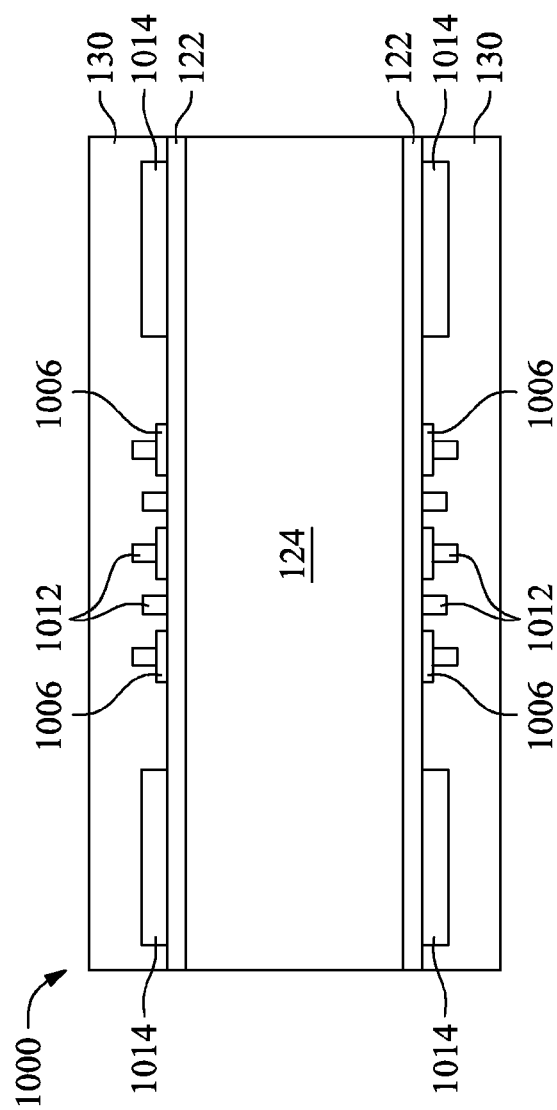

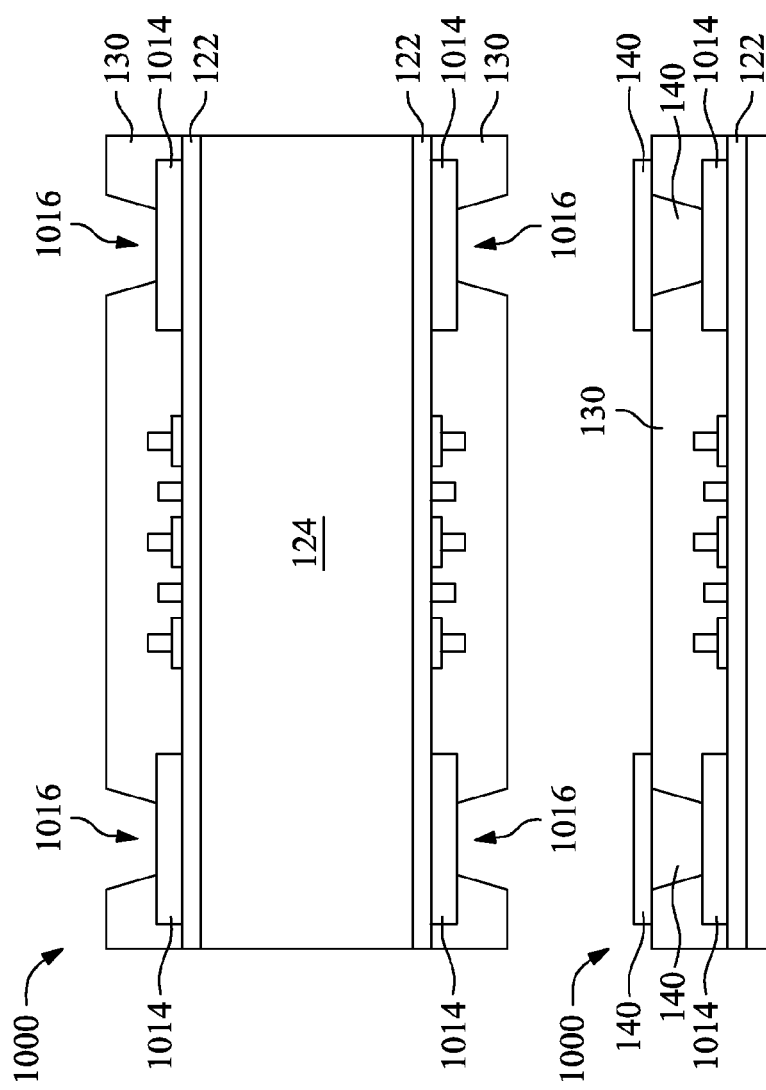
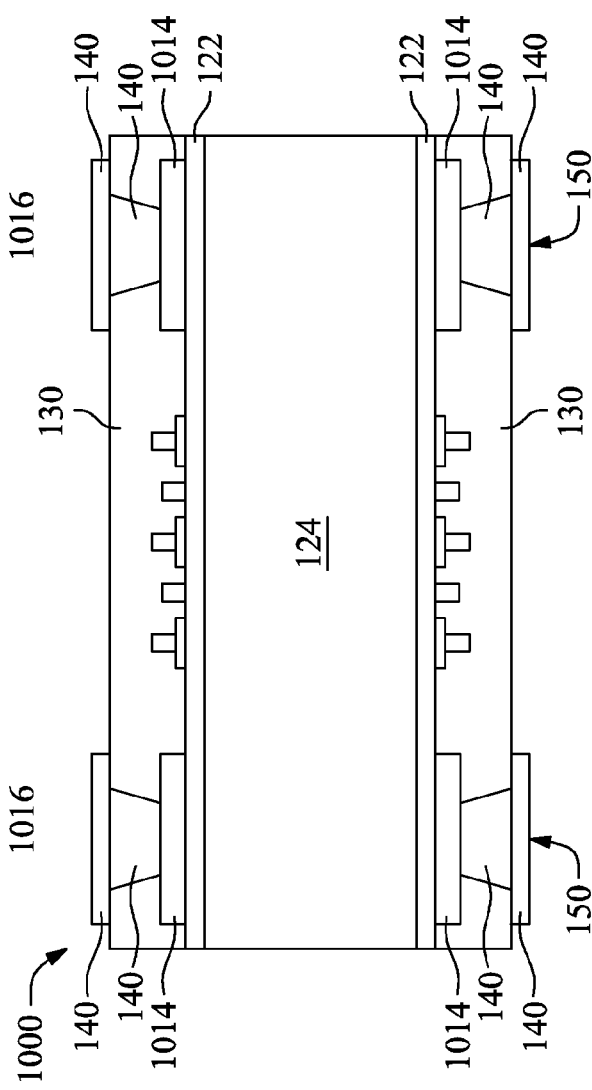

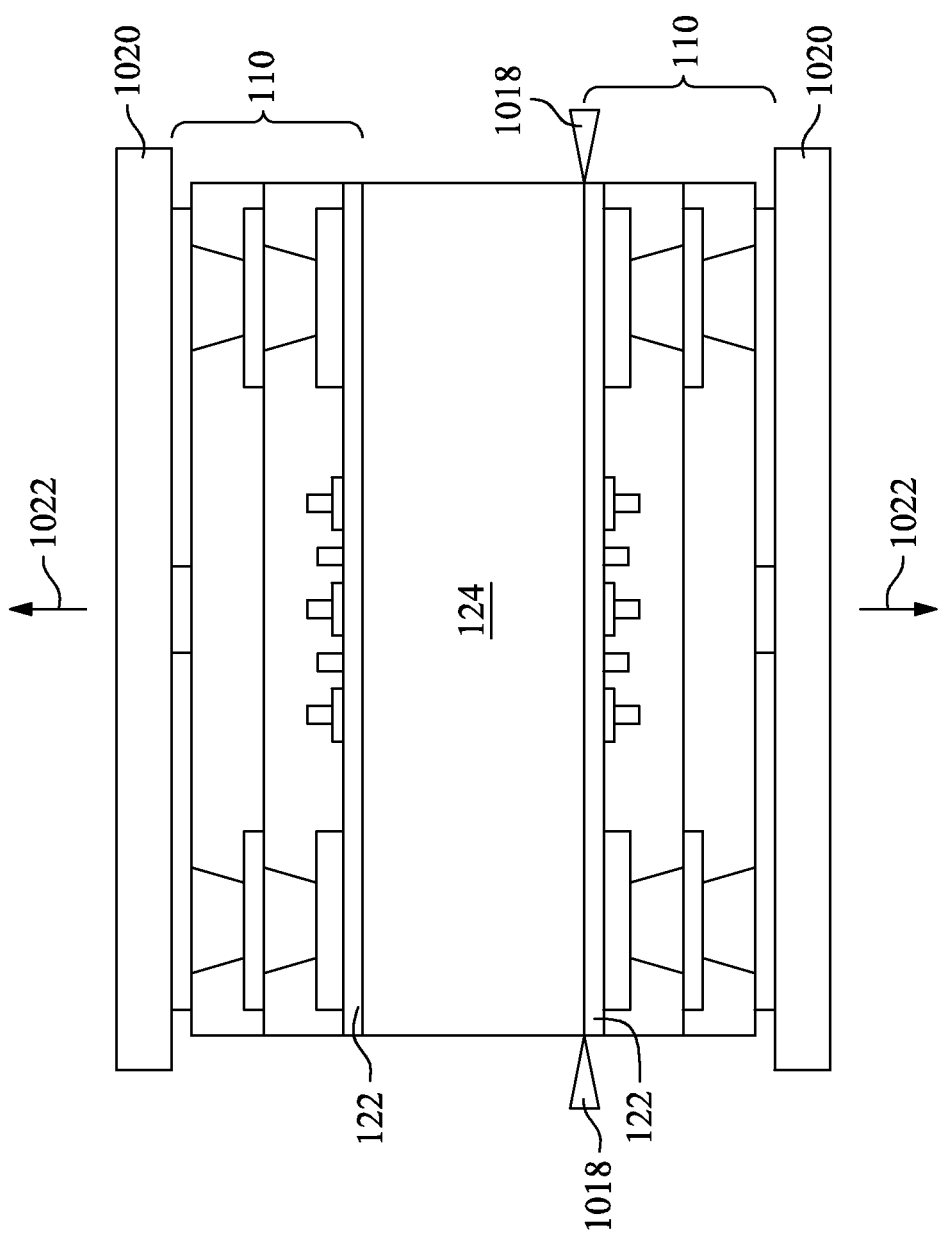

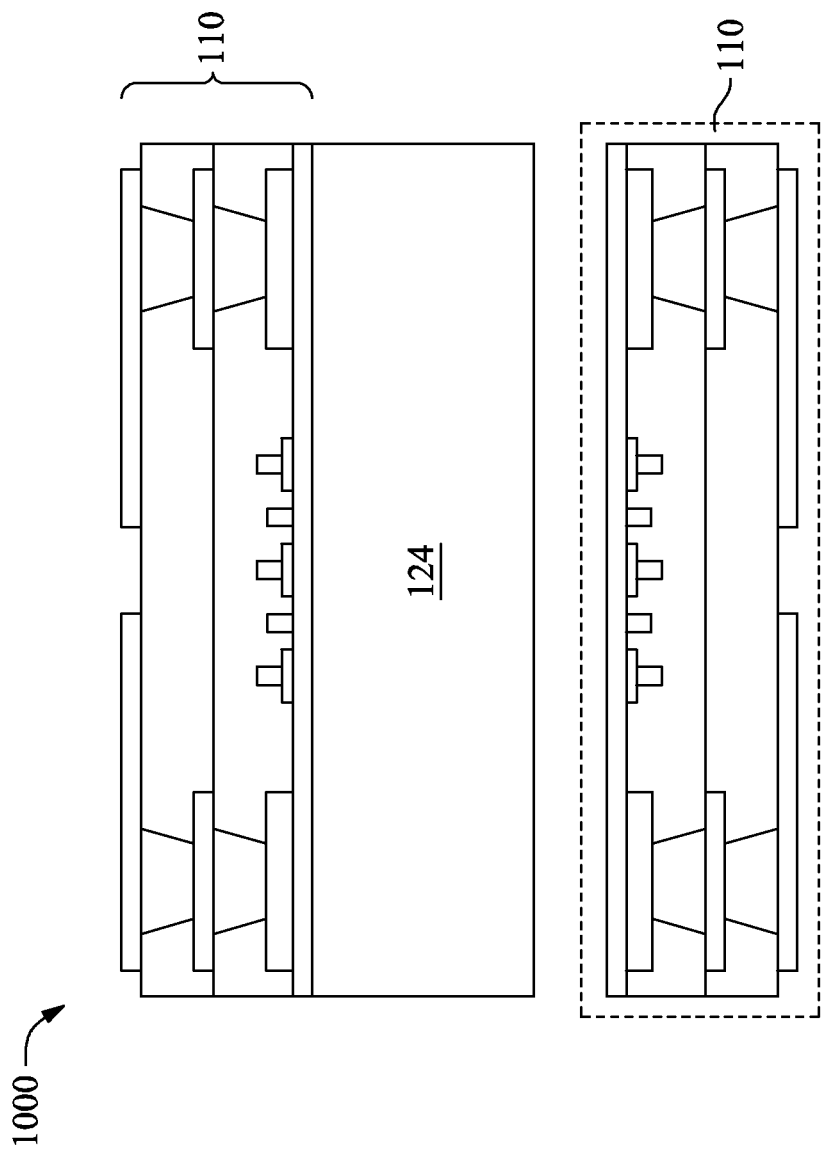

US 9,418,928 B2

PROTRUSION BUMP PADS FOR BOND-ON-TRACE PROCESSING

This application is a continuation-in-part of U.S. patent application Ser. No. 14/148,482, filed on Jan. 6, 2014, entitled "Protrusion Bump Pads for Bond-on-Trace Processing," which application is hereby incorporated herein by reference.

BACKGROUND

In Bond-on-Trace (BoT) processing, a singulated, integrated circuit (IC) chip is flipped and connected to bond pad portions of traces formed on another substrate. A subset of the traces, also known as skip lines, includes traces extending between the bond pad portions, such as for fan-out purposes. Thus, the trace pitch is less than the bond pad pitch. However, this resulted in solder bonds inadvertently bridging connections with adjacent traces, and made probe testing overly challenging as the trace pitch fell below the diameter of common testing probes.

BRIEF DESCRIPTION OF THE DRAWINGS

The present disclosure is best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIG. 2 is a sectional view of at least a portion of apparatus in an intermediate stage of manufacture according to one or more aspects of the present disclosure.

FIG. 3 is a sectional view of the apparatus shown in FIG. 2 in a subsequent stage of manufacture according to one or more aspects of the present disclosure.

FIG. 7 is a sectional view of the apparatus shown in FIG. 6 in a subsequent stage of manufacture according to one or more aspects of the present disclosure.

FIG. 8 is a sectional view of the apparatus shown in FIG. 7 in a subsequent stage of manufacture according to one or more aspects of the present disclosure.

FIGS. 11-24 are cross-sectional views of various intermediate steps in a manufacture of a device in accordance with some embodiments.

DETAILED DESCRIPTION OF ILLUSTRATIVE EMBODIMENTS

Figure 1A:
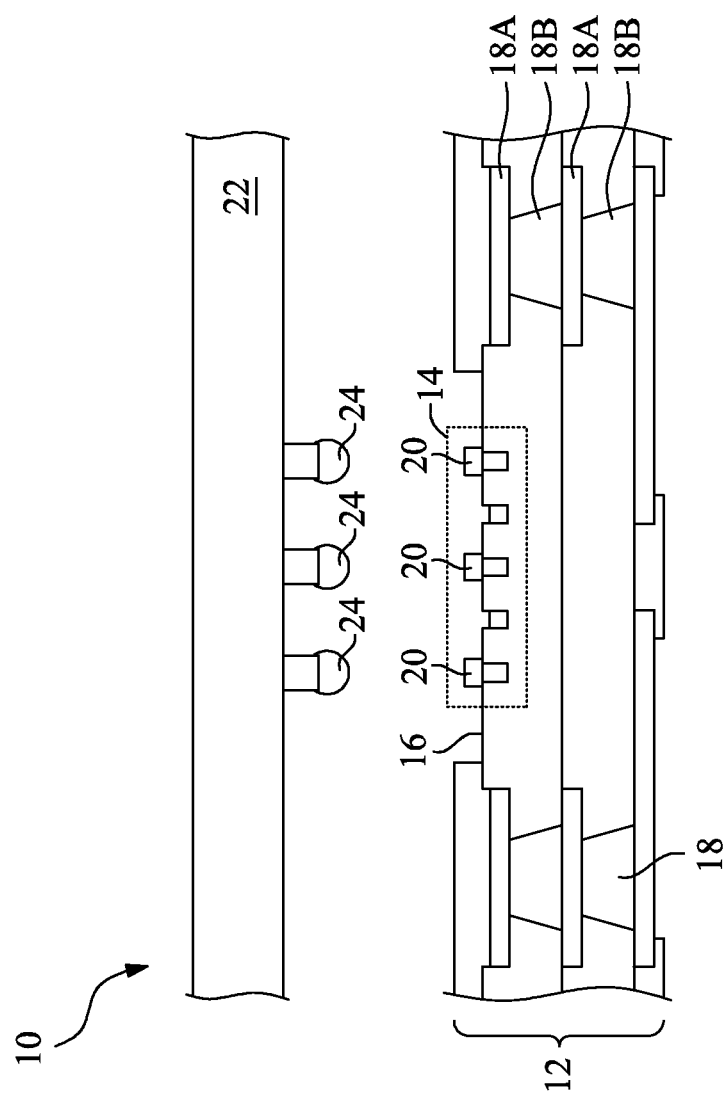
FIGS. 1A and 1B are sectional and top down views of at least a portion of apparatus according to one or more aspects of the present disclosure.

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

FIG. 1A is a sectional view of at least a portion of an apparatus 10 in an intermediate stage of manufacture according to one or more aspects of the present disclosure. The apparatus 10 comprises a substrate 12 and a plurality of conductive traces 14 disposed on a side 16 of the substrate. Conductive members 18 may extend into the substrate 12. Conductive members 18 may include conductive vias 18B and contact pads 18A disposed on conductive vias 18B. Conductive traces 14 may be physically connected to ones of contact pads 18A, which is more readily apparent in the top down view of side 16 of substrate 12 illustrated by FIG. 1B. Bump pads 20 each protrude from conductive traces 14. Portions of conductive traces 14 not covered by bump pads 20 are recessed within the side 16 of the substrate 12. The apparatus 10 may further comprise an integrated circuit chip 22 and a plurality of conductive bumps 24 coupled between the integrated circuit chip and corresponding ones of the bump pads 20.

Figure 1B:
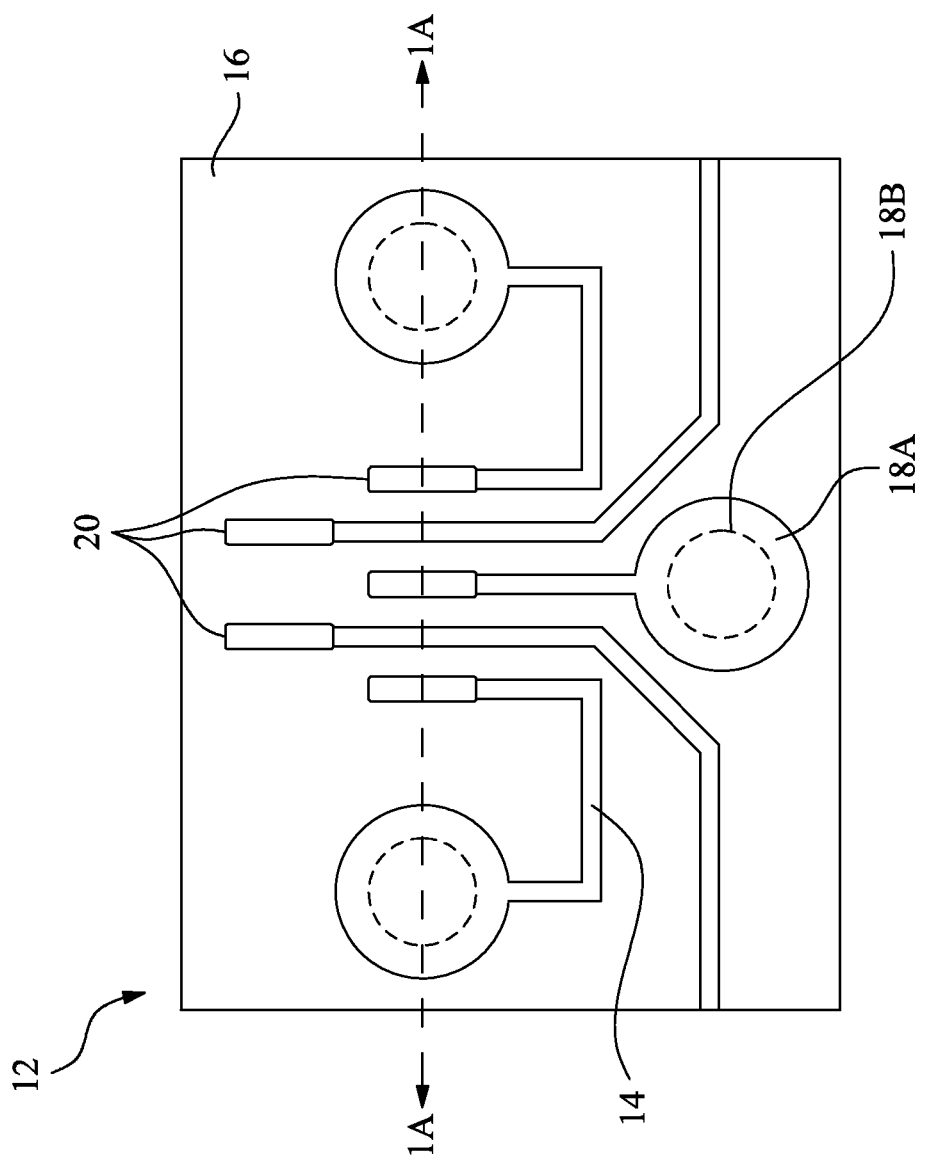

FIG. 1B illustrates a top down view of a portion of side 16 of substrate 12. The sectional view of FIG. 1A may be taken across line 1A-1A illustrated in FIG. 1B. As illustrated by FIG. 1B, bump pads 20 may be electrically connected to conductive traces 14, which may be electrically connected to contact pads 18A and conductive vias 18B (shown in ghost) of conductive members 18. Bump pads 20 may cover at least a portion of conductive traces 14. Exposed portions of conductive traces 14 may be recessed from a surface of substrate 12. Bump pads 20 may be used to electrically connect substrate 12 to other device features such as integrated circuit chip 22 or other package substrates, interposers, device dies, printed circuit boards, and the like.

FIG. 2 is a sectional view of an implementation of the apparatus 10 shown in FIG. 1, herein designated by the reference numeral 100. The apparatus 100 is depicted in FIG. 2 as being in an intermediate stage of manufacture according to one or more aspects of the present disclosure. The apparatus 100 comprises build-up layers 110 on opposing sides of a carrier substrate 120. The carrier substrate 120 may comprise one or more conductive layers 122 formed on one or both sides of a core 124. The core 124 and/or the carrier substrate 120 may comprise a single-sided or double-sided copper clad laminate (CCL), a prepreg or ajinomoto build-up film (ABF), paper, glass fiber, non-woven glass fabric, one or more layers of copper, nickel, aluminum, and/or other materials, elements, and/or compositions. The one or more conductive layers 122 may comprise one or more layers of copper, nickel, aluminum, and/or other materials.

Among other components, the build-up layers 110 may comprise multiple dielectric layers 130 and metallization layers 140. The dielectric layers 130 may comprise a prepreg or ajinomoto build-up film (ABF). Alternatively, or additionally, the dielectric layers 130 may comprise paper, glass fiber, and/non-woven glass fabric, one or more of which may be applied by lamination. Alternatively, or additionally, the dielectric layers 130 may comprise silicon dioxide, silicon nitride, silicon oxynitride, an oxide, a nitrogen containing oxide, aluminum oxide, lanthanum oxide, hafnium oxide, zirconium oxide, hafnium oxynitride, a combination thereof, and/or other materials. The dielectric layers 130 may be formed by sputtering, spin-on coating, chemical vapor deposition (CVD), low-pressure CVD, rapid thermal CVD, atomic layer CVD, and/or plasma enhanced CVD, perhaps utilizing tetraethyl orthosilicate and oxygen as a precursor. The dielectric layers 130 may also be formed by an oxidation process, such as wet or dry thermal oxidation in an ambient environment comprising an oxide, water, nitric oxide, or a combination thereof, and/or other processes. Fabrication of the dielectric layers 130 may also comprise chemical-mechanical polishing or planarizing (hereafter collectively referred to as CMP), isotropic etching, and/or anisotropic etching, among other processes. The dielectric layers 130 may be formed to a thickness ranging between about eight angstroms and about 200 angstroms, although other thicknesses are also within the scope of the present disclosure.

The metallization layers 140 may comprise one or more of copper, titanium, aluminum, nickel, gold, alloys and/or combinations thereof, and/or other materials. Portions of metallization layers 140 may be vertically interconnected to form interconnect structures 150 (e.g., having contact pads, conductive lines, and or vias). Other portions of metallization layers 140 may form conductive traces 154. Conductive traces 154 may be connected to contact pad portions of interconnect structures 150 (see e.g., FIG. 1B). The metallization layers 140 may be formed by plating, perhaps to a thickness ranging between about four microns and about 25 microns. Alternatively, or additionally, the metallization layers 140 may be formed by CVD and/or other processes, and may have a thickness ranging between about eight angstroms and about 200 angstroms, although other thicknesses are also within the scope of the present disclosure.

Bond pads 155 may be disposed on interconnect structures 150. Interconnect structures 150 and/or bond pads 155 thereof may have diameter and/or other lateral dimension ranging between about 150 microns and about 400 microns. The bond pads 155 may each be a BGA (ball grid array) pad, such as may be subsequently utilized in forming an interconnection with a "mother board" PCB (printed circuit board) and/or another PCB, PWB (printed wiring board), PCA (printed circuit assembly), PCBA (PCB assembly), CCA (circuit card assembly), backplane assembly, and/or apparatus. A pitch P1, or the lateral offset between neighboring bond pads 155, may range between about 300 microns and about 500 microns.

FIG. 3 is a sectional view of the apparatus 100 shown in FIG. 2 in a subsequent stage of manufacture according to one or more aspects of the present disclosure, in which the sections of build-up layers 110 have been removed from the carrier substrate 120. One of the sections of build-up layers 110 is not shown in FIG. 3, although this is merely for the sake of simplifying the following discussion, and a person having ordinary skill in the art will readily recognize that both sections of the build-up layers 110 may be processed according to one or more of the aspects of the present disclosure. The build-up layers 110 may be removed from the carrier substrate 120 by routing, melting, mechanical force, etching and/or other processes.

A photoresist layer may then be coated, exposed, and developed on one or both sides of the build-up layers 110. For example, photoresist portions 210 may be formed on a first side 112 of the build-up layers 110, and a photoresist layer 220 may substantially cover a second side 114 of the build-up layers 110. Although FIG. 3 illustrates a particular number of interconnect structures 150 and conductive traces 154, any number of metallization layers 140 may be provided.

The photoresist portions 210 on the first side 112 of the build-up layers 110 are formed over portions of conductive traces 154 (portions 154A) while other portions of conductive traces 154 (portions 154B) may remain exposed to the subsequent lithographic processing. The photoresist portions 210 and layer 220 may comprise a chemically amplified photoresist or a non-chemically amplified photoresists, and may be positive-tone or negative tone. Processing of the photoresist portions 210 and layer 220 may comprise a deposition process including, for example, lamination of a dry film type photoresist, spin-on-coating, dip coating, brush coating, and/or ink-jet dispensing, among others. A post deposition baking step may be performed to remove solvent and/or other unwanted components, such as to a temperature ranging between about 40° C. and about 200° C., perhaps for a baking time ranging between about 10 seconds and about 10 minutes.

Figure 4:
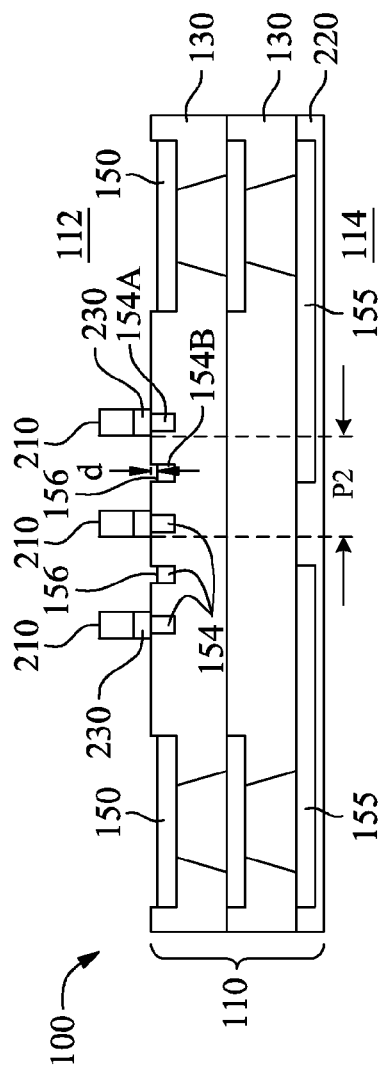
FIG. 4 is a sectional view of the apparatus shown in FIG. 3 in a subsequent stage of manufacture according to one or more aspects of the present disclosure.

FIG. 4 is a sectional view of the apparatus 100 shown in FIG. 3 in a subsequent stage of manufacture according to one or more aspects of the present disclosure, in which the photoresist portions 210 over portions 154A of conductive traces 154 have been utilized as a mask during an etching process. The etching process is utilized to remove the portions of the outermost metallization layers 140 that are not protected by the photoresist portions 210 and layer 220. Thus, on the first side 112 of the build-up layers 110, the outermost metallization layer 140 is removed down to the outermost dielectric layer 130. However, the etching of the outermost metallization layer 140 over exposed portions 154B of conductive traces 154 is continued for a sufficient time so as to recess the exposed surface 156 of the conductive traces 154 within the outer surface of the outermost dielectric layer 130. The exposed surface 156 of portions 154B of conductive traces 154 thus forms a portion of a recessed trace, whereas the masked portion of each of portions 154A of conductive traces 154 forms a protrusion bump pad 230. The depth d of the recess over the recessed trace, below the surface of the surrounding dielectric layer 130, may be less than about seven microns, such as about four microns, although other depths are also within the scope of the present disclosure. A pitch P2 between adjacent protrusion bump pads 230 may be about 40 μm to about 150 μm, although other pitches are also within the scope of the present disclosure.

Figure 5:
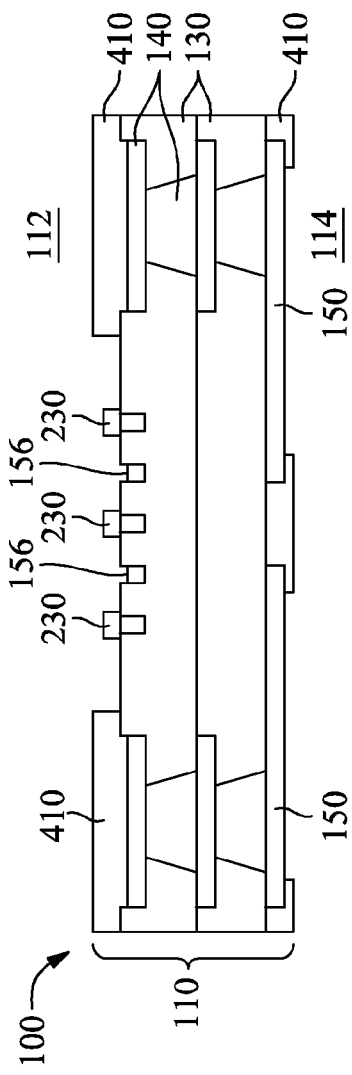
FIG. 5 is a sectional view of the apparatus shown in FIG. 4 in a subsequent stage of manufacture according to one or more aspects of the present disclosure.

FIG. 5 is a sectional view of the apparatus 100 shown in FIG. 4 in a subsequent stage of manufacture according to one or more aspects of the present disclosure, in which the photo resist portions 210 and the photoresist layer 220 have been removed, and solder resist portions 410 have been formed by conventional means. The solder resist portions 410 may comprise a heat-resistant coating material, and may aid in protecting the underlying layers.

Figure 6:
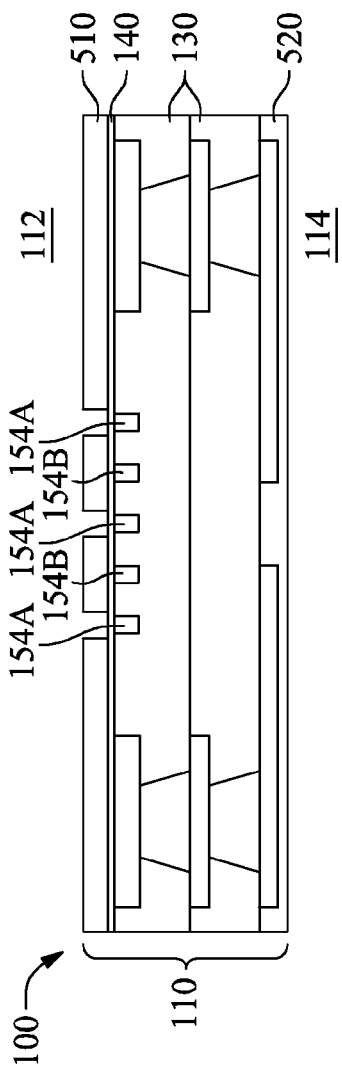
FIG. 6 is a sectional view of the apparatus shown in FIG. 2 in a subsequent stage of manufacture according to one or more aspects of the present disclosure.

Other methods of forming the protrusion bump pads 230 and recessed traces 156 are also within the scope of the present disclosure. One such example is depicted in FIGS. 6-8. FIG. 6 is a sectional view of the apparatus 100 shown in FIG. 2 in a subsequent stage of manufacture according to one or more aspects of the present disclosure. As above, the build-up layers 110 have been removed from the carrier substrate 120. A photoresist layer may then be coated, exposed, and developed on one or both sides of the build-up layers 110. For example, photoresist portions 510 may be formed on the first side 112 of the build-up layers 110, and a photoresist layer 520 may substantially cover the second side 114 of the build-up layers 110. The photoresist portions 510 on the first side 112 of the build-up layers 110 may substantially cover the entire first side 112, including over portions 154B of conductive traces 154, except for over portions 154A of conductive traces 154, which remain exposed for subsequent processing.

FIG. 7 is a sectional view of the apparatus 100 shown in FIG. 6 in a subsequent stage of manufacture according to one or more aspects of the present disclosure, in which the photoresist portions 510 have been utilized as a mask during a metallization process. The metallization process is utilized to add metal to the exposed portions 154A of conductive traces 154. The material added by the metallization process may comprise one or more of copper, titanium, aluminum, nickel, gold, alloys and/or combinations thereof, and/or other materials. The metallization may be formed by electroplating, electro-chemical plating, electroless plating, CVD, epitaxial growth, and/or other processes, and may add material to the exposed portions 154A to a thickness ranging between about five microns and about 50 microns, although other thicknesses are also within the scope of the present disclosure.

FIG. 8 is a sectional view of the apparatus 100 shown in FIG. 7 in a subsequent stage of manufacture according to one or more aspects of the present disclosure, in which the photoresist portions 510 and the photoresist layer 520 have been removed. FIG. 8 also reflects the result of an etching process selective to the interconnect structures 150, conductive traces 154 (both portions 154A and 154B), and the outermost metallization layer 140. For example, the outermost metallization layer 140 is removed down to the outermost dielectric layer 130, including to a degree sufficient to recess the exposed surface 156 of portions 154B of conductive traces 154 within the outer surface of the outermost dielectric layer 130. As above, the exposed surface 156 of portions 154B of conductive traces 154 forms a portion of a recessed trace, whereas the now protruding portion of portions 154A of conductive traces 154 forms a protrusion bump pad 230. The tops of the interconnect structures 150 and bump pads 230 (the protruding portion over conductive traces 154) are also etched back during this process. Therefore, the process step of adding metallization, illustrated in FIG. 7, should be adjusted to ensure that sufficient height of the protruding pillars remains, even after this subsequent etch step. Additional processing may ensue, such as to form solder resist portions and/or otherwise arrive at the embodiment depicted in FIG. 5.

Figure 9:
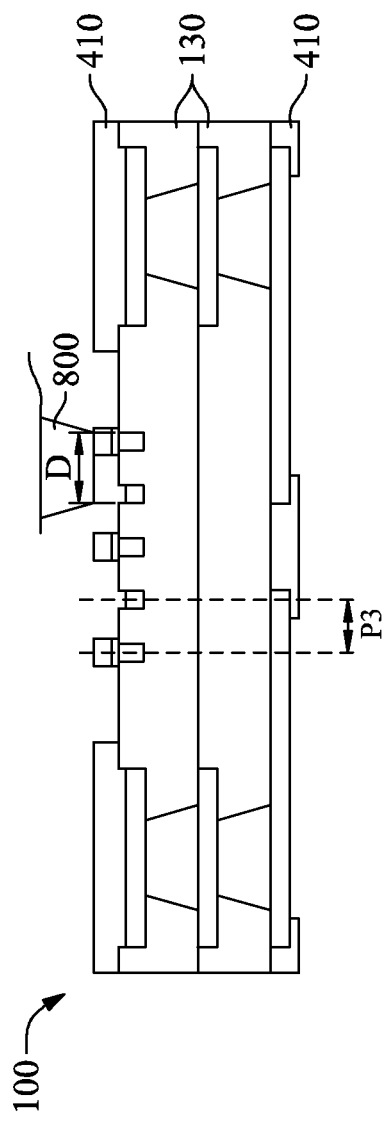
FIG. 9 is a sectional view of the apparatus shown in FIG. 5 in a subsequent stage of manufacture according to one or more aspects of the present disclosure.

FIG. 9 is a sectional view of the apparatus 100 shown in FIG. 5 in which a testing probe 810 has been brought into contact with one of the protrusion bump pads 230 on conductive traces 154. The tip of the testing probe 810 may have a diameter D, which may be substantially greater than the pitch P3 of conductive traces 154. For example, the pitch P3 may be less than about 30 µm, and the testing probe 810 may have a tip diameter D of about 30 µm, if not significantly larger. However, because portions of conductive traces 154 are recessed, they are not shorted by misalignment of the testing probe 810 relative to bump pads 230.

Figure 10:
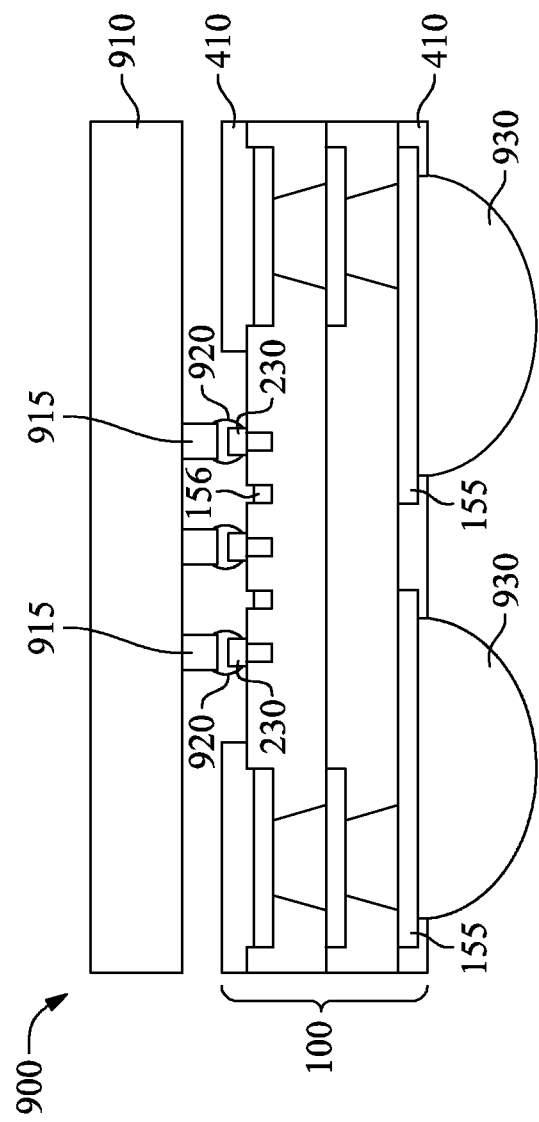
FIG. 10 is a sectional view of the apparatus shown in FIG. 5 in a subsequent stage of manufacture according to one or more aspects of the present disclosure.

FIG. 10 is a sectional view of at least a portion of an apparatus 900 according to one or more aspects of the present disclosure. The apparatus 900 includes the apparatus 100 shown in FIG. 5, a die 910, and a plurality of conductive bumps 920 coupled between the integrated circuit chip and corresponding ones of the bump pads. The die 910 may be or comprise one or more integrated circuit chips, packages, and the like. The conductive bumps 920 may comprise solder, gold, conductive paste, and/or other electrically conductive materials. The die 910 may comprise pads 915 configured to be aligned with the protrusion bump pads 230 prior to be coupled by the conductive bumps 920. Conductive traces 154 may connect protrusion bump pads 230 to interconnect structures 150 (see e.g., FIG. 1B). Furthermore, connectors 930 (e.g., BGA balls) may be disposed on bond pads 155. Connectors 930 may electrically connect apparatus 100 to other device features such as other package substrates, interposers, device dies, printed circuit boards, and the like.

Other embodiments having recessed traces and methods of forming thereof are also within the scope of the present disclosure. For example, FIGS. 11-24 illustrate cross-sectional views of a manufacture of an apparatus 1000 in accordance with some embodiments. Generally, FIGS. 11-24 illustrate a process in which a coreless substrate is formed having embedded traces and bump pads having a height greater than the embedded traces. While FIGS. 11-24 illustrate a process using double-sided processing techniques for illustrative purposes, other embodiments may utilize single-sided processing techniques.

Referring first to FIG. 11, a carrier substrate 120 is provided. Carrier substrate 120 includes a core 124 having conductive layers 122 formed on opposing sides of core 124. As discussed in greater detail below, conductive layer 122 acts as a seed layer for an electroplating process to form conductive traces and pads. Core 124 may be any suitable carrier substrate, such as an organic core substrate comprising epoxy-impregnated glass-fiber laminate, polymer-impregnated glass-fiber laminate, prepreg or ajinomoto build-up film (ABF), paper, glass fiber, non-woven glass fabric, and the like, for example. Alternatively, core 124 may comprise other materials, such as, stainless steel, glass, and the like. Core 124 may provide temporary structural support during the formation of various build-up layers in subsequent process steps.

Conductive layers 122 comprising a conductive material (e.g., copper) are formed on opposing surfaces of core 124. Conductive layers 122 are formed using any suitable process. For example, when core 124 comprises an organic core material, conductive layers 122 may be formed by laminating a conductive foil (e.g., copper foil) on opposing sides of core 124. As another example, conductive layers 122 may be formed using plating or sputtering processes when core 124 comprises stainless steel, glass, and the like. Other methods for forming conductive layers 122 may also be used.

FIG. 12 illustrates formation of patterned mask layers 1002 on conductive layers 122 in accordance with some embodiments. In some embodiments, patterned mask layers 1002 comprise a photoresist material that has been coated or laminated over the surface, exposed in accordance with the desired pattern, and developed to include openings 1004, which expose portions of conductive layer 122. The pattern of exposed portions of conductive layer 122 corresponds to the pattern of bump pads (e.g., bump pads 1006 in FIG. 13) to be used for electrically connecting to other device features (e.g., other device dies).

For example, FIG. 13 illustrates the device after bump pads 1006 have been formed overlying conductive layers 122 in accordance with some embodiments. Bump pads 1006 may be formed by, for example, depositing a seed layer (not shown) in openings 1004 (see FIG. 12) and electroplating a conductive material using the patterned mask layer 1002 (see FIG. 12) to define the shape of bump pads 1006. In some embodiments, bump pads 1006 may comprise a different material than conductive layer 122, and the material of bump pads 1006 may be selected so that conductive layer 122 may be selectively etched without significantly etching bump pads 1006 in subsequent process steps (see e.g., FIG. 22A). For example, when conductive layer 122 comprises copper, bump pads 1006 may be formed of nickel, tin, or other suitable conductive materials. Bump pads 1006 may have a height H of about 0.5 μm to about 10 μm, for example.

Also shown in FIG. 13 is the removal of patterned mask layers 1002. For example, a plasma ashing and/or wet strip process may be used to remove patterned mask layers 1002. Optionally, the plasma ashing process may be followed by a wet dip in a sulfuric acid ($H_2SO_4$) solution to clean apparatus 1000 and remove remaining mask material.

FIG. 14 illustrates formation of other patterned mask layers 1008 on conductive layer 122 and bump pads 1006. In some embodiments, patterned mask layers 1008 comprise a photoresist material that has been coated or laminated over the surface, exposed in accordance with the desired pattern, and developed to include openings 1010/1010', which expose portions of bump pads 1006 as well as conductive layer 122. The pattern of exposed portions of conductive layers 122 and bump pads 1006 corresponds to the pattern of conductive features in the completed apparatus 1000. For example, openings 1010 may be used to pattern conductive traces while openings 1010' may be used to pattern contact pads for metallization layers. In such embodiments, widths of openings 1010' for contact pads may be greater than widths of openings 1010 for conductive traces. For example, widths of openings 1010 is between about 2 μm to about 30 μm while widths of openings 1010' is between about 30 μm to about 150 μm. In alternative embodiments, openings 1010 and 1010' may have different dimensions. Wider openings for the formation of contact pads may be used to accommodate the formation of various metallization layers 140 in subsequent process steps (see e.g., FIG. 19).

FIG. 15 illustrates the device after openings 1010/1010' are filled with a conductive material. For example, conductive traces 1012 have been formed on bump pads 1006/conductive layer 122, and contact pads 1014 have been formed overlying conductive layer 122. Conductive traces 1012 and contact pads 1014 may be formed by, for example, electro-plating a conductive material using the patterned mask layer 1008 (see FIG. 14) as a mask. In some embodiments, conductive traces 1012/contact pads 1014 may comprise a same material (e.g., copper) as conductive layer 122, and conductive layer 122 may be used as a seed layer for forming conductive traces 1012 and contact pads 1014. In a top down view of apparatus 1000 (see e.g., FIG. 22B), individual conductive traces 1012 may be physically and electrically connected to contact pads 1014, and in subsequent process steps various metallization layers 140 may be formed to electrically connect to contact pads 1014 (see e.g., FIG. 19).

Also shown in FIG. 15 is the removal of patterned mask layers 1008. For example, a plasma ashing and/or wet strip process may be used to remove patterned mask layers 1008. Optionally, the plasma ashing process may be followed by a wet dip in a sulfuric acid ($H_2SO_4$) solution to clean apparatus 1000 and remove remaining mask material.

FIG. 16 illustrates the formation of dielectric layers 130 overlying and between contact pads 1014, conductive traces 1012, bump pads 1006, and conductive layer 122. Dielectric layers 130 may comprise a prepreg (e.g., e.g., FR4 epoxy resin, M6 epoxy resin, and the like) or ABF. Alternatively, or additionally, the dielectric layers 130 may comprise paper, glass fiber, and/non-woven glass fabric, one or more of which may be applied by lamination. For example, a vacuum laminator may be used to dispose a dielectric material on core 124, and an oven curing process may be applied to adhere dielectric layers 130 to contact pads 1014, conductive traces 1012, bump pads 1006, and conductive layer 122. As another example, a hot press process may apply the dielectric material to contact pads 1014, conductive traces 1012, bump pads 1006, and conductive layer 122 under suitable heat and/or pressure conditions for a suitable duration (e.g., one to two hours) to form dielectric layers 130.

Alternatively, or additionally, dielectric layers 130 may comprise silicon dioxide, silicon nitride, silicon oxynitride, an oxide, a nitrogen containing oxide, aluminum oxide, lanthanum oxide, hafnium oxide, zirconium oxide, hafnium oxynitride, a combination thereof, and/or other materials. Dielectric layers 130 may be formed by sputtering, spin-on coating, CVD, low-pressure CVD, rapid thermal CVD, atomic layer CVD, and/or plasma enhanced CVD, perhaps utilizing tetraethyl orthosilicate and oxygen as a precursor. Dielectric layers 130 may also be formed by an oxidation process, such as wet or dry thermal oxidation in an ambient environment comprising an oxide, water, nitric oxide, or a combination thereof, and/or other processes.

Although FIGS. 14-16 illustrate the formation of dielectric layers 130 after conductive traces 1012/contact pads 1014, an alternative order of formation may be used. For example, in alternative embodiments, dielectric layers 130 may be formed on bump pads 1006 and conductive layers 122 prior to the formation of conductive traces 1012/contact pads 1014. Openings may be patterned in dielectric layers 130 to expose portions of bump pads 1006 and conductive layers 122 using any suitable process such as, laser drilling, a combination of photolithography and etching, and the like. Such openings may then be filled with a conductive material to form conductive traces 1012/contact pads 1014, which may be electrically connected to bump pads 1006 and conductive layers 122. A planarization process may further be used to remove excess materials from a top surface of dielectric layer 130.

Referring next to FIG. 17, dielectric layers 130 may be patterned to include openings 1015 to expose contact pads 1014. The patterning of dielectric layers 130 may include any suitable process such as laser drilling, a combination of photolithography and etching, and the like.

FIG. 18 illustrates the formation of additional conductive features, such as metallization layers 140. Metallization layers 140 (e.g., vias) may be formed in dielectric layer 130 by filling openings 1016 with a conductive material. In an embodiment, the conductive material may be formed by depositing a seed layer on sidewalls of openings 1016. The seed layer (not shown) may be formed of copper, nickel, gold, any combination thereof and/or the like. Once the seed layer has been deposited in the opening, a conductive material, such as tungsten, titanium, aluminum, copper, any combinations thereof and/or the like, is filled into the opening, using, for example, an electrochemical plating process. The conductive material may overfill openings 1016, and excess materials (e.g., excess conductive materials) are removed from surfaces of dielectric layer 130. In some embodiments a planarization process, such as a CMP process, mechanical grinding process, or other etch-back technique is used to remove the excess materials, thereby forming metallization layers 140 in dielectric layer 130.

Additional metallization layers 140 (e.g., lines) may be formed overlying dielectric layer 130. For example, a patterned photoresist (not shown) may be formed on dielectric layer 130. Openings in the patterned photoresist may be used to define a shape of such metallization layers 140. Such openings may be filled with a conductive material, for example, by first depositing a seed layer (not shown) on bottom surfaces and/or sidewalls of such openings and filling the openings using an electrochemical plating process. The patterned photoresist may then be removed.

Figure 19:
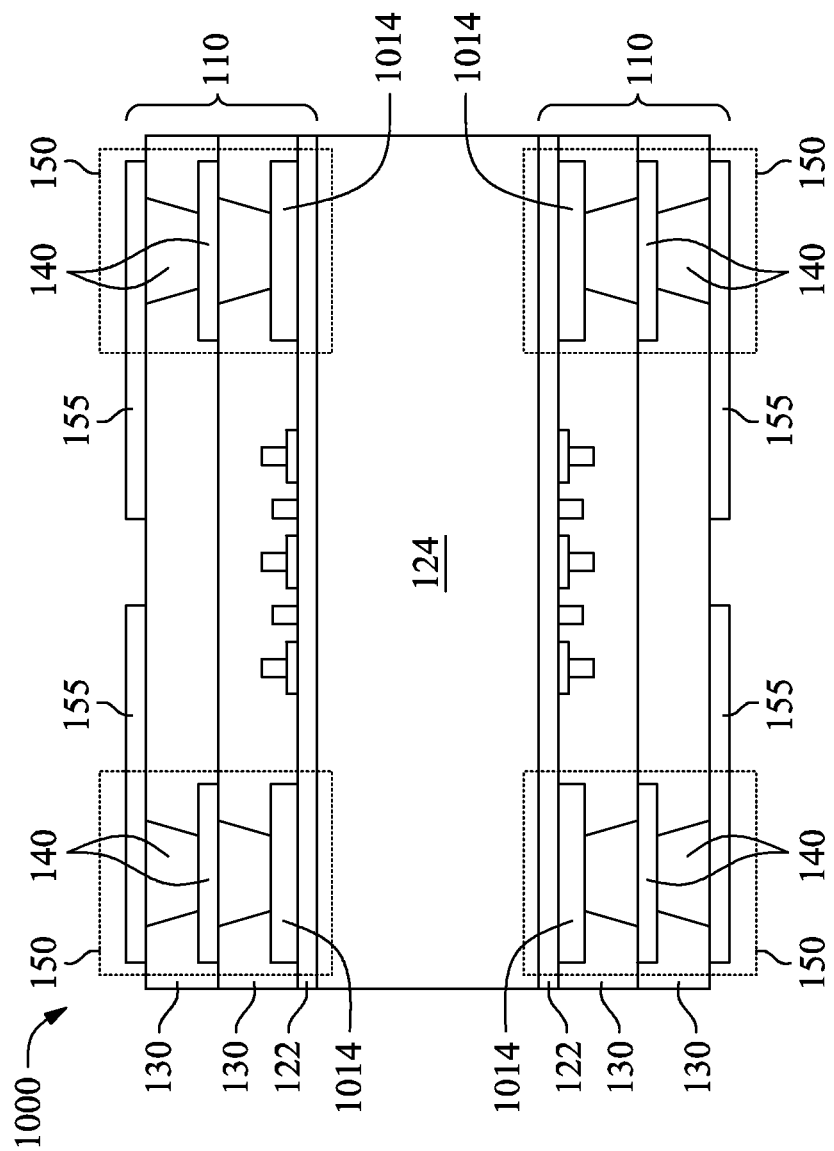

Subsequently, additional dielectric layers 130 and metallization layers 140 may be formed. An example resulting structure is illustrated in FIG. 19. The various metallization layers 140 may form conductive pillars 150 extending form contact pads 1014. Thus, build-up layers 110 are formed on opposing sides of core 124. Build-up layers 110 may include dielectric layers 130, metallization layers 140, bump pads 1006, conductive traces 1012, and contact pads 1014. Bond pads 155 may further be disposed on metallization layer 140. Although a particular number of dielectric layers 130 and conductive features (e.g., metallization layers 140, bump pads 1006, conductive traces 1012, contact pads 1014, etc.) are illustrated, any number of such dielectric layers and/or conductive features may be included in apparatus 1000 depending on device design.

FIGS. 20 and 21 illustrate the removal of build-up layers 110 from core 124. For example, a section of build-up layers 110 underlying core 124 may be removed. In some embodiments, build-up layers 110 are removed using mechanical force. For example, referring to FIG. 20, mechanical tools 1018 are wedged between core 124 and a conductive layer 122. Mechanical tools 1018 create a separation between core 124 and conductive layer 122 at edge portions of core 124. Next, vacuum clamps 1020 may be used to apply mechanical force to opposing sides of core 124. Vacuum clamps 1020 may apply mechanical force in opposing directions (as indicated by arrows 1022), and the mechanical force physically separates build-up layers 110 from core 124.

In some embodiments, build-up layers 110 may be separated from core 124 without significantly damaging other features in the illustrated structure due the relatively weak adhesive bond between core 124 and conductive layers 122. For example, conductive layers 122 may be applied to core 124 using a relatively weak lamination process (e.g., without undergoing an extensive cure). The weakness of the bond between core 124 and conductive layer 122 may further be exploited by the separation of core 124 and conductive layer 1222 at edge portions due to the application of mechanical tools 1018. Thus, build-up layers 110 may be removed from core 124 as illustrated by FIG. 21. The section of build-up layers 110 above core 124 may also be removed using a similar process. Other process for removing build-up layers 110, such as routing, melting, etching, and/or other processes may also be used.

Figure 22A:
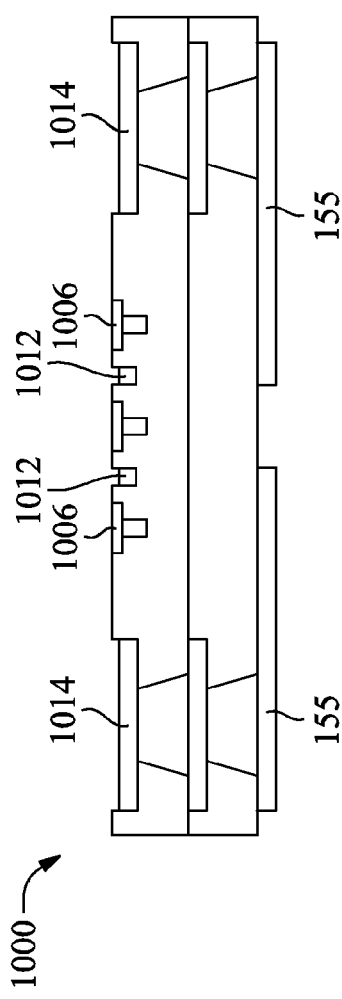
Figure 22B:
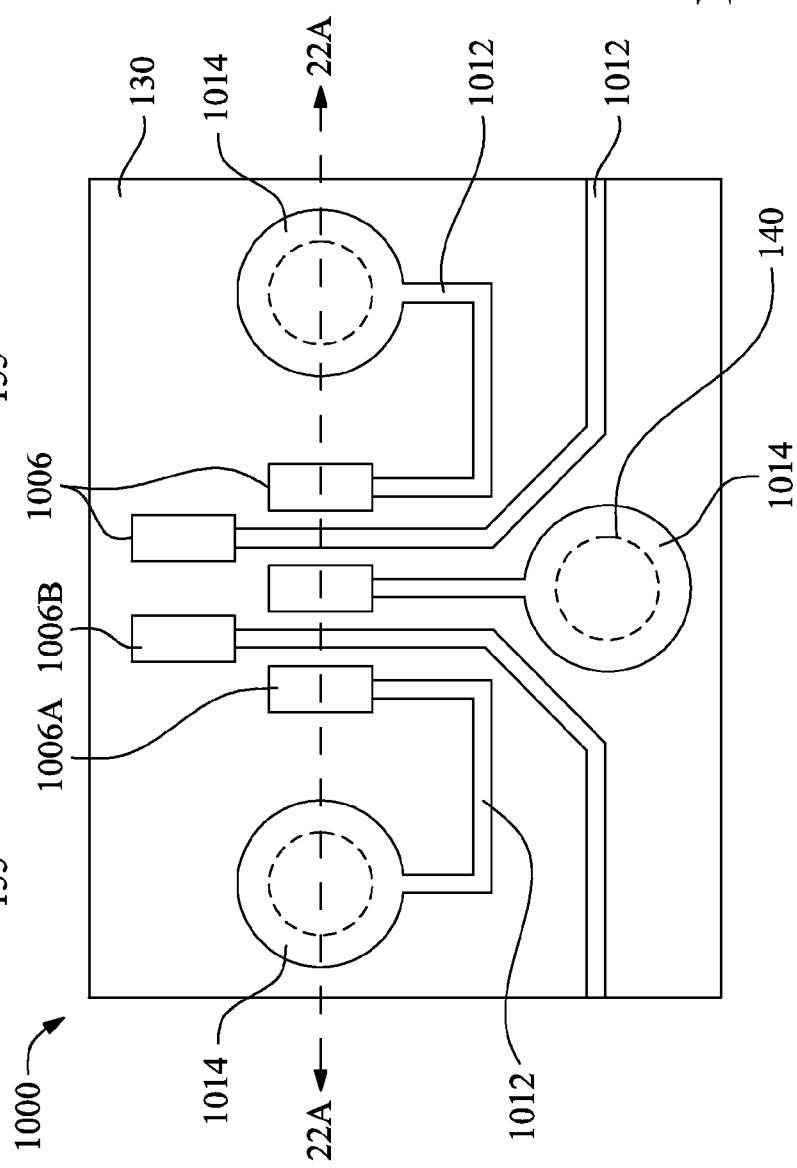

FIGS. 22A and 22B illustrate cross sectional and top down views of the apparatus 1000 shown in FIG. 21 in a subsequent stage of manufacture where conductive layer 122 has been removed. The cross sectional view of FIG. 22A may be taken across line 22A-22A illustrated in FIG. 22B. One of the sections of build-up layers 110 from FIG. 21 is not shown in FIGS. 22A and 22B, although this is merely for the sake of simplifying the following discussion, and a person having ordinary skill in the art will readily recognize that both sections of the build-up layers 110 may be processed according to one or more of the aspects of the present disclosure.

Referring first to FIG. 22A, conductive layer 122 (see FIG. 17) may be removed using a suitable etching process, for example. The etching of conductive layer 122 may further etch portions of conductive traces 1012 not covered by bump pads 1006 as well as contact pads 1014. For example, the etching conductive layer 122 may use a suitable chemical etchant that selectively removes the material of conductive layer 122 and conductive traces 1012/contact pads 1014 (e.g., copper) without significantly removing the material of bump pads 1006 (e.g., nickel, tin, and the like). The suitable chemical etchant may have a high etch selectivity between the materials of conductive layer 122 (and conductive traces 1012/contact pads 1014) and bump pads 1006. In some embodiments, suitable chemical etchants include a sulfuric acid ($H_2SO_4$) or hydrogen peroxide ($H_2O_2$) based chemical etchant, for example, and bump pads 1006 may act as a etch stop layer or hard mask during the etching of conductive layer 122. Thus, exposed surfaces of conductive traces 1012 and contact pads 1014 may be recessed from a top surface of dielectric layer 130 in apparatus 1000. As further illustrated by FIG. 22A, bump pads 1006 may be substantially level with a top surface of dielectric layer 130.

Referring to FIG. 22B, bump pads 1006 may be electrically connected to conductive traces 1012, which may be electrically connected to contact pads 1014 and metallization layers 140 (shown in ghost). Bump pads 1006 may cover at least a portion of conductive traces 1012. Exposed portions of conductive traces 1012 may be recessed during the removal of conductive layer 122. Bump pads 1006 may be used to electrically connect apparatus 1000 to other device features such as other package substrates, interposers, device dies, printed circuit boards, and the like. The recessing of various exposed conductive traces 1012 reduces manufacturing defects (e.g., solder bridges) during the bonding of such other device features to bump pads 1006. Furthermore, bump pads 1006 on adjacent conductive traces 1012 may not be laterally aligned. For example, in FIG. 22B, bump pads 1006A and 1006B may not intersect any common lines (e.g., line 22A-22A). Alternatively, bump pads 1006 on at least a subset of adjacent conductive traces 1012 may be laterally aligned. That is, bump pads 1006 and conductive traces 1012 may be disposed in any configuration depending on device design.

Figure 23:
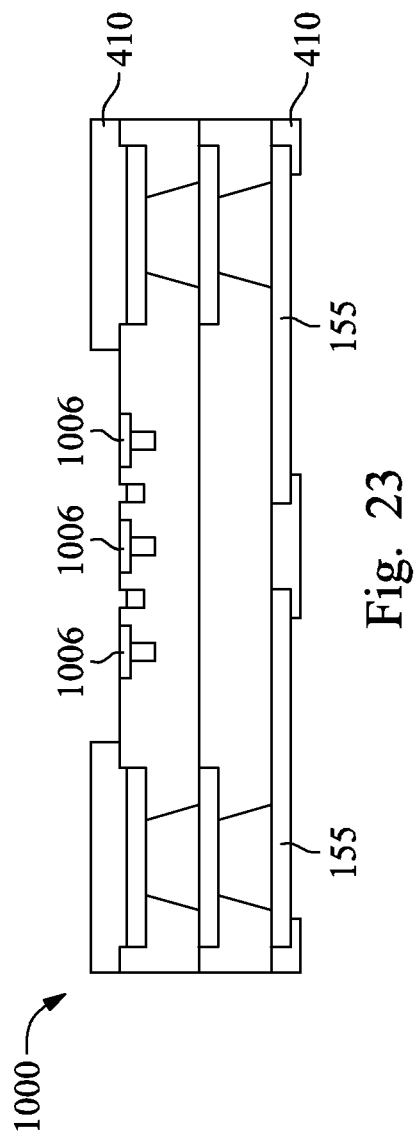

Additional processing may ensue, such as to form solder resist portions (e.g., solder resist portions 410 exposing bond pads 155 and bump pads 1006) as illustrated by FIG. 23. Furthermore, in some embodiments, a testing probe may be applied to apparatus 1000, such as testing probe 810 of FIG. 9. Because bump pads 1006 are not recessed from a top surface of dielectric layer 130, the testing probe may more reliably contact and test the electrical connections of bump pads 1006.

Figure 24:
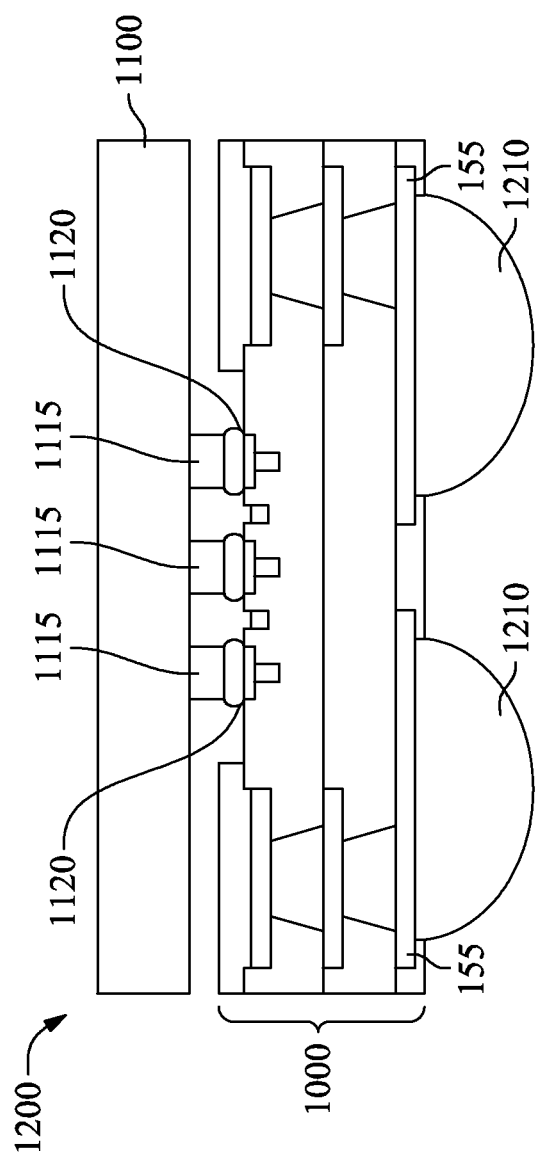

FIG. 24 is a sectional view of at least a portion of an apparatus 1200 according to one or more aspects of the present disclosure. The apparatus 1200 includes the apparatus 1000 shown in FIG. 23, a die 1100, and a plurality of conductive bumps 1120 coupled between the integrated circuit chip and corresponding ones of bump pads 1006. Because bump pads 1006 are not recessed in apparatus 1000, physical connection between conductive bumps 1120 and bump pads 1006 may be made with increased reliability. The die 1100 may be or comprise one or more integrated circuit chips, packages, and the like. The conductive bumps 1120 may comprise solder, gold, conductive paste, and/or other electrically conductive materials. The die 1100 may comprise pads 1115 configured to be aligned with the bump pads 1106 prior to be coupled by the conductive bumps 1120. In some embodiments, conductive bumps 1120 may not be in direct physical contact with conductive traces 1012 due to the recessing of exposed portions of conductive traces 1012. Additional external connectors (e.g., bumps 1210 comprising solder, gold, conductive paste, and the like) may further be disposed on bond pads 155. Bumps 1210 may be used to electrically connect apparatus 1200 to other device features, such as, other device dies, interposers, printed circuit boards, package substrates, and the like (not shown).

Figure 25:
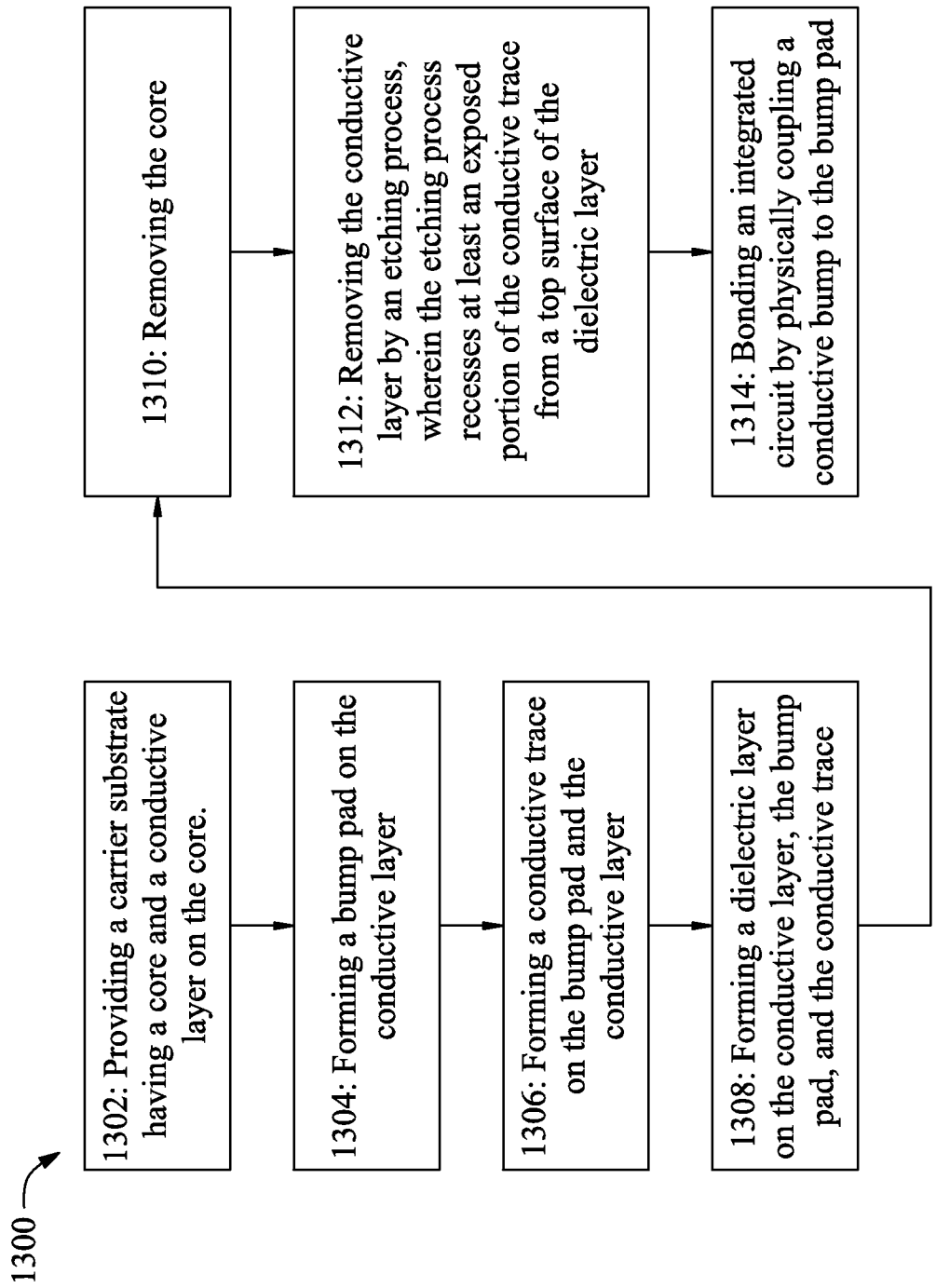
FIG. 25 is a process flow of a method for manufacturing a device in accordance with some embodiments.

FIG. 25 illustrates a process flow 1300 for forming an apparatus (e.g., apparatus 1200) in accordance with some embodiments. Process flow 1300 may start with step 1302 where a carrier substrate (e.g., carrier substrate 120) is provided. The carrier substrate may include a core (e.g., core 124) and a conductive layer (e.g., conductive layer 122) on the core. In some embodiments, the core may be an organic core having laminated conductive layers disposed on opposing sides. Other embodiments the conductive layer may be disposed on only one side of the core. In step 1304, bump pads (e.g., bump pads 1006) are formed on the conductive layer. The bump pads and the conductive layer may comprise different conductive materials. In some embodiments, the conductive layer may comprise a material that can be selectively etched without significantly etching the bump pads. For example, the conductive layer may comprise copper while the bump pads may comprise nickel, tin, and the like.

Next in step 1306, a conductive trace (e.g., conductive trace 1012) is formed on the bump pad and the conductive layer. The conductive trace and the conductive layer may comprise the same conductive materials (e.g., copper). In step 1308, a dielectric layer (e.g., dielectric layer 130) is formed on the conductive layer, the bump pad and the conductive trace. Additional conductive features may also be formed, such as additional dielectric layers and/or conductive features (e.g., contact pads, conductive pillars, conductive traces, bump pads, and the like).

After the formation of various features, the core is removed in step 1310. In step 1312, the conductive layer is removed using an etching process. The etching process may further recess at least a portion of the conductive trace from a top surface of the dielectric layer. For example, exposed portions of the conductive trace (i.e., portions of the conductive trace not covered by the bump pad) may be removed. The etching process may use a chemical etchant that has a sufficiently high etch selectivity between the materials of the conductive trace/conductive layer (e.g., copper) and the bump pad (e.g., nickel, tin, and the like). Thus, the etching process may not significantly etch the bump pads, and after etching top surfaces of the bump pads and the dielectric layer may be substantially level. Finally, in step 1314, another device feature (e.g., integrated circuit chip 1100) may be bonded by physically coupling a conductive bump (e.g., conductive bump 1120) to the bump pad. In some embodiments, no conductive bumps may be physically coupled to exposed surfaces of the conductive trace.

In accordance with an embodiment, an apparatus includes a dielectric layer, a conductive trace in the dielectric layer, and a bump pad. The conductive trace includes a first portion having an exposed top surface, wherein the exposed top surface is recessed from a top surface of the dielectric layer. Furthermore, the bump pad is disposed over and is electrically connected to a second portion of the conductive trace.

In accordance with another embodiment, a method includes providing a carrier substrate having a core and a conductive layer on the core. The method further includes forming a bump pad on the conductive layer and forming a conductive trace. The bump pad and the conductive layer comprise different conductive materials. The conductive trace includes a first portion on the conductive layer and a second portion on the bump pad. A dielectric layer is formed on the conductive layer, the bump pad, and the conductive trace. Next, the core is removed and an etching process is used to remove the conductive layer. The etching process further recesses the first portion of the conductive trace from a top surface of the dielectric layer.

In accordance with yet another embodiment, a method includes providing an integrated circuit chip having a plurality of conductive bumps and providing an apparatus. The apparatus includes a dielectric layer, a plurality of bump pads, and a plurality of conductive traces in the dielectric layer. The plurality of conductive traces each includes a first portion having an exposed top surface, wherein the exposed top surface is recessed from a top surface of the dielectric layer. Each of the plurality of conductive traces further includes a second portion, wherein at least one of the one or more bump pads covers the second portion. The method further includes bonding the integrated circuit chip to the apparatus by physically coupling the plurality of conductive bumps to the plurality of bump pads.

The foregoing outlines features of several embodiments so that a person having ordinary skill in the art may better understand the aspects of the present disclosure. A person having ordinary skill in the art should appreciate that they may readily use the present disclosure as a basis for designing or modifying other processes and structures for carrying out the same purposes and/or achieving the same advantages of the embodiments introduced herein. A person having ordinary skill in the art should also realize that such equivalent constructions do not depart from the spirit and scope of the present disclosure, and that they may make various changes, substitutions and alterations herein without departing from the spirit and scope of the present disclosure.

The Abstract at the end of this disclosure is provided to comply with 37 C.F.R. §1.72(b) to allow the reader to quickly ascertain the nature of the technical disclosure. It is submitted with the understanding that it will not be used to interpret or limit the scope or meaning of the claims.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method comprising:
   providing a carrier substrate comprising:
      a core; and
      a first conductive layer on the core;
   forming a first bump pad on the first conductive layer, wherein the first bump pad and the first conductive layer comprise different conductive materials;
   forming a first conductive trace, wherein the first conductive trace comprises:
      a first portion on the first conductive layer; and
      a second portion on the first bump pad;
   forming a first dielectric layer on the first conductive layer, the first bump pad, and the first conductive trace;
   removing the core; and
   removing the first conductive layer using an etching process, wherein the etching process further recesses the first portion of the first conductive trace from a top surface of the first dielectric layer.

2. The method of claim 1, wherein the first conductive trace and the first conductive layer comprise a same conductive material, and wherein the first bump pad is an etch stop layer during etching process.

3. The method of claim 2, wherein the first conductive trace and the first conductive layer comprise copper, wherein the first bump pad comprises nickel or tin, and wherein the etching process comprises using a hydrogen peroxide or sulfuric acid based chemical etchant.

4. The method of claim 1 further comprising, after removing the first conductive layer:
   providing an integrated circuit chip comprising a conductive bump; and
   physically coupling the conductive bump to the first bump pad.

5. The method of claim 1, wherein after removing the first conductive layer, a top surface of the first bump pad is substantially level with the top surface of the first dielectric layer.

6. The method of claim 1, wherein forming the first bump pad comprises:
forming a first patterned mask layer on the first conductive layer, wherein the first patterned mask layer comprises a first opening exposing the first conductive layer;
filling the first opening with a different conductive material than the first conductive layer; and
removing the first patterned mask layer.

7. The method of claim 1, wherein forming the first bump pad comprises:
forming a second patterned mask layer on the first conductive layer and the first bump pad, wherein the second patterned mask layer comprises a second opening exposing the first conductive layer and the first bump pad;
filling the second opening with a same conductive material as the first conductive layer; and
removing the second patterned mask layer.

8. The method of claim 1, wherein the carrier substrate further comprises a second conductive layer on an opposing side the core as the first conductive layer, and wherein the method further comprises:
forming a second bump pad on the second conductive layer, wherein the second bump pad and the second conductive layer comprise different conductive materials;
forming a second conductive trace, wherein the second conductive trace comprises:
a third portion on the second conductive layer; and
a fourth portion on the second bump pad;
forming a second dielectric layer on the second conductive layer, the second bump pad, and the second conductive trace;
removing the core; and
removing the second conductive layer using an etching process, wherein the etching process further recesses the third portion of the second conductive trace from a surface of the second dielectric layer.

9. A method comprising:
providing integrated circuit chip comprising a plurality of conductive bumps;
providing an apparatus comprising:
a dielectric layer;
a plurality of bump pads in the dielectric layer; and
a plurality of conductive traces in the dielectric layer, wherein the plurality of conductive traces each comprise:
a first portion having an exposed top surface, wherein the exposed top surface is recessed from a top surface of the dielectric layer; and
a second portion, wherein at least one of the plurality of bump pads covers the second portion; and
bonding the integrated circuit chip to the apparatus by physically coupling the plurality of conductive bumps to the plurality of bump pads.

10. The method of claim 9, wherein providing apparatus comprises:
forming the plurality of bump pads on a conductive layer, wherein the plurality of bump pads and the conductive layer comprise different conductive materials;
forming the plurality of conductive traces on the plurality of bump pads and the conductive layer, wherein the plurality of conductive traces and the conductive layer comprise a same conductive material; and
removing the conductive layer using an etching process, wherein the etching process further recesses each of the first portions of the plurality of conductive traces from the top surface of the dielectric layer, and wherein the plurality of bump pads are etch stop layers during the etching process.

11. The method of claim 10, wherein the plurality of bump pads comprise nickel or tin, wherein the conductive layer and the plurality of conductive traces comprise copper, and wherein the etching process comprises using a hydrogen peroxide or sulfuric acid based chemical etchant.

12. The method of claim 9, wherein top surfaces of the plurality of bump pads are at least as high as a top surface of the dielectric layer.

13. The method of claim 9, wherein bonding the integrated circuit chip to the apparatus comprises not physically coupling any of the plurality of conductive bumps to the first portions of the plurality of conductive traces.

14. A method comprising:
providing a carrier substrate comprising a core;
forming a dielectric layer comprising a first conductive trace and a second conductive trace over the carrier substrate;
removing the core;
forming a bump pad on the first conductive trace; and
recessing a top surface of the second conductive trace below a top surface of the dielectric layer.

15. The method of claim 14, wherein the bump pad comprises a different material than the first conductive trace.

16. The method of claim 15, wherein forming the dielectric layer comprising the first conductive trace and the second conductive trace comprises:
after forming the bump pad, patterning a first mask to define a first opening and a second opening over the carrier substrate, wherein the first opening exposes the bump pad, and wherein the second opening exposes the carrier substrate;
forming the first conductive trace in the first opening;
forming the second conductive trace in the second opening;
removing the first mask; and
depositing a dielectric layer over and extending along sidewalls of the first conductive trace, the second conductive trace, and the bump pad.

17. The method of claim 15, wherein recessing the top surface of the second conductive trace comprises using an etching chemical that selectively etches the second conductive trace at a faster rate than the bump pad.

18. The method of claim 14, wherein the carrier substrate further comprises a conductive layer over the core, wherein forming the bump pad comprises:
removing first portions of the conductive layer; and
using a second mask to cover a second portion of the conductive layer on the first conductive trace while removing the first portions of the conductive layer.

19. The method of claim 18, wherein recessing the top surface of the second conductive trace comprises using the second mask to cover the bump pad during recessing the top surface of the second conductive trace.

20. The method of claim 18, wherein forming the bump pad further comprising:
removing the second mask;
patterning a third mask over the dielectric layer, wherein the third mask comprises an opening exposing the second portion of the conductive layer; and forming a conductive material in the opening on the second portion of the conductive layer.

* * * * *